US006689661B2

(12) United States Patent
Durcan et al.

(10) Patent No.: US 6,689,661 B2
(45) Date of Patent: Feb. 10, 2004

(54) METHOD FOR FORMING MINIMALLY SPACED MRAM STRUCTURES

(75) Inventors: D. Mark Durcan, Boise, ID (US); Trung T. Doan, Boise, ID (US); Roger Lee, Boise, ID (US); Dennis Keller, Boise, ID (US); Ren Earl, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/828,823

(22) Filed: Apr. 10, 2001

(65) Prior Publication Data

US 2002/0146849 A1 Oct. 10, 2002

(51) Int. Cl.⁷ .............................................. H01L 21/336
(52) U.S. Cl. ............................ 438/268; 438/3; 438/73; 438/244; 438/253; 438/258; 438/320; 438/551; 438/597; 438/601; 438/621; 438/671; 438/706; 438/711; 438/714
(58) Field of Search ............................ 438/268, 3, 73, 438/244, 253, 258, 320, 551, 597, 601, 621, 671, 706, 711, 714

(56) References Cited

U.S. PATENT DOCUMENTS

| 5,139,904 | A | * | 8/1992 | Auda et al. ................... 430/30 |
|---|---|---|---|---|
| 5,841,692 | A | * | 11/1998 | Gallagher et al. ........... 365/173 |
| 6,010,829 | A | * | 1/2000 | Rogers et al. ................ 430/316 |
| 6,034,877 | A | * | 3/2000 | Bronner et al. ................ 365/51 |
| 6,048,739 | A | * | 4/2000 | Hurst et al. ...................... 438/3 |
| 6,153,443 | A | * | 11/2000 | Durlam et al. ................... 438/3 |
| 6,190,959 | B1 | * | 2/2001 | Bronner et al. .............. 438/244 |
| 6,372,651 | B1 | * | 4/2002 | Yang et al. ................... 438/706 |
| 6,444,406 | B1 | * | 9/2002 | Ito et al. ...................... 430/320 |
| 6,451,651 | B1 | * | 9/2002 | Park et al. .................... 438/253 |
| 6,524,941 | B2 | * | 2/2003 | Hsu et al. ..................... 438/601 |
| 6,551,852 | B2 | * | 4/2003 | Tuttle ............................ 438/73 |

\* cited by examiner

Primary Examiner—Michael S. Lebentritt
Assistant Examiner—Michael K. Luhrs
(74) Attorney, Agent, or Firm—Dickstein Shapiro Morin & Oshinsky LLP

(57) ABSTRACT

A method of forming minimally spaced apart MRAM structures is disclosed. A photolithography technique is employed to define patterns an integrated circuit, the width of which is further reduced by etching to allow formation of patterns used to etch digit line regions with optimum critical dimension between any of the two digit line regions. Subsequent pinned and sense layers of MRAM structures are formed over the minimally spaced digit regions.

55 Claims, 9 Drawing Sheets

METHOD FOR FORMING MINIMALLY SPACED MRAM STRUCTURES

FIELD OF THE INVENTION

The present invention relates MRAM semiconductor structures and, more particularly, to a method of forming minimally spaced MRAM structures.

BACKGROUND OF THE INVENTION

Magnetic random access memories (MRAMs) employ magnetic multilayer films as storage elements. When in use, an MRAM cell stores information as digital bits, which in turn depend on the alternative states of magnetization of thin magnetic multilayer films forming each memory cell. As such, the MRAM cell has two stable magnetic configurations, high resistance representing a logic state 0 and low resistance representing a logic state 1, or vice versa.

A typical multilayer-film MRAM includes a number of bit or digit lines intersected by a number of word lines. At each intersection, a film of a magnetically coercive material is interposed between the corresponding bit line and digit line. Thus, this magnetic material and the multilayer films from the digit lines form a magnetic memory cell which stores a bit of information.

The basic memory element of an MRAM is a patterned structure of a multilayer material, which is typically composed of a stack of different materials, such as copper (Cu), tantalum (Ta), permalloy (NiFe) or aluminum oxide ($Al_2O_3$), among others. The stack may contain as many as ten different overlapping material layers and the layer sequence may repeat up to ten times. Fabrication of such stacks requires deposition of the thin magnetic materials layer by layer, according to a predefined order.

FIG. 1 shows an exemplary conventional MRAM structure including MRAM stacks 22 which have three respective associated bit or digit lines 18. The digit lines 18, typically formed of copper (Cu), are first formed in an insulating layer 16 formed over underlayers 14 of an integrated circuit (IC) substrate 10. Underlayers 14 may include, for example, portions of integrated circuitry, such as CMOS circuitry. A pinned layer 20, typically formed of ferromagnetic materials, is provided over each digit line 18. A pinned layer is called "pinned" because its magnetization direction does not rotate in the presence of applied magnetic fields.

Conventional digit lines and pinned layers, such as the digit lines 18 and the pinned layers 20 of FIG. 1, are typically formed by a damascene process. Although damascene processes are preferred for copper interconnects, in the MRAM cell context the damascene process poses a drawback, in that there is an overlay of the pinned layer 20 with respect to the associated digit line 18, which occurs primarily as a result of photoresist misalignment. On FIG. 1, this overlay is illustrated by an overlay distance D, on each side of the digit line 18. Because of technical and processing limitations, conventional damascene processing is also unable to obtain long digit lines and their respective pinned layers.

Another drawback of using a conventional damascene process to produce the digit lines 18 of an MRAM is the inability of the process to achieve a minimal space or minimum critical dimension CD (FIG. 1) between two adjacent digit lines and, consequently, between two adjacent memory cells. Current values of the minimal space or critical dimension are in the range of 0.20 $\mu$m. However, with increased packing density of MRAM cells, the minimal space must decrease to values less than or equal to 0.1 $\mu$m, or even less than or equal to 0.05 $\mu$m, and current damascene processing does not afford these values with current 248 nm lithography.

Accordingly, there is a need for an improved method for fabricating MRAM structures, such as pinned layers and digit lines, which are minimally spaced from each other, as well as a method for decreasing the critical dimension between two adjacent MRAM structures formed on an integrated circuit substrate.

SUMMARY OF THE INVENTION

The present invention provides a method for forming minimally spaced MRAM structures, such as pinned layers and underlying digit lines, formed over various underlayers of an integrated circuit substrate. The present invention employs photolithography techniques to define masking patterns in an insulating layer formed over an integrated circuit substrate, by etching through a photolithography mask. The width of the masking patterns formed in the insulating layer is further reduced, for example by etching, to form reduced-width masking patterns, which are used to etch another insulating layer in which digit lines of MRAM structures are formed. The method of the present invention allows a further decrease in the critical dimension and tighter packing of MRAM structures subsequently formed.

These and other features and advantages of the invention will be more apparent from the following detailed description which is provided in connection with the accompanying drawings, which illustrate exemplary embodiments of the invention.

DETAILED DESCRIPTION OF THE PREFERRED EMBODIMENTS

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "metal" is intended to include not only elemental metal, but metal with other trace metals or in various alloyed combinations with other metals as known in the semiconductor art. The term "metal" is also intended to include conductive oxides of such metals, as well as doped semiconductors and their respective conductive oxides.

The present invention provides a method for fabricating minimally spaced MRAM structures over a substrate which contains portions of integrated circuitry, such as CMOS devices and circuitry. The present invention employs a photoresist that is removed through an exposure technique to define mask patterns on an integrated circuit substrate on which subsequent MRAM structures are formed. The width of the mask patterns is subsequently reduced by etching, for example, to form reduced-width mask patterns to etch another insulating layer in which digit lines of MRAM structures minimally spaced apart are formed.

Figure 2:
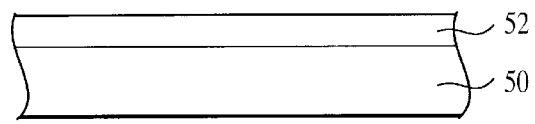
FIG. 2 illustrates a partial cross-sectional view of a semiconductor topography, at an intermediate stage of the processing, wherein an MRAM structure will be constructed in accordance with the present invention.

Referring now to the drawings, where like elements are designated by like reference numerals, FIGS. 2–18 illustrate an exemplary embodiment of a method of forming MRAM structures constructed with minimal space between any of two adjacent MRAM structures. FIG. 2 depicts a portion of a semiconductor substrate 50 on which underlying layer 52 has been already formed according to well-known methods of the prior art. The underlying layer 52 could include, for example, circuit layers forming CMOS devices and circuits.

Figure 3:
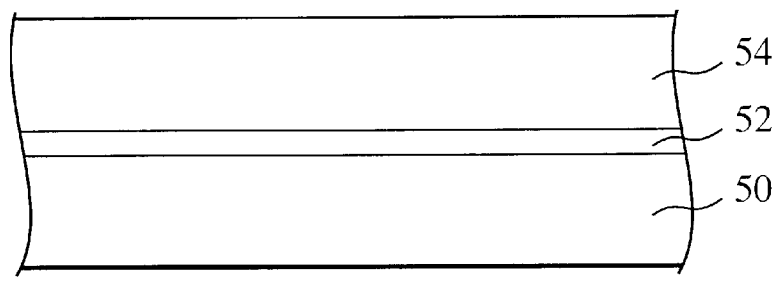
FIG. 3 illustrates a partial cross-sectional view of the MRAM structure of the present invention at a stage of processing subsequent to that shown in FIG. 2.

Referring now to FIG. 3, an insulating layer 54 is formed over the substrate 50 and the underlying layer 52. In an exemplary embodiment of the invention, the insulating layer 54 is blanket deposited by spin coating to a thickness of about 1,000 Angstroms to about 10,000 Angstroms. However, other known deposition methods, such as sputtering by chemical vapor deposition (CVD), plasma enhanced CVD (PECVD), or physical vapor deposition (PVD), may be used also in accordance with the characteristics of the IC device already formed. The insulating layer 54 may be formed of a conventional insulator, for example, a thermal oxide of silicon, such as SiO or $SiO_2$, or a nitride such as $Si_3N_4$. Alternatively, a high temperature polymer, such as a polyimide, or a low dielectric constant inorganic material may also be employed.

Figure 4:
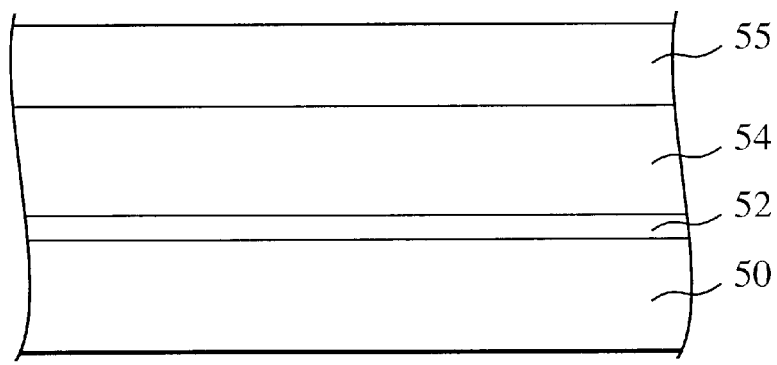
FIG. 4 illustrates a partial cross-sectional view of the MRAM structure of the present invention at a stage of processing subsequent to that shown in FIG. 3.

Next, as illustrated in FIG. 4, a photoresist layer 55 is formed over the insulating layer 54. In an exemplary embodiment of the present invention, the photoresist layer 55 is formed of a positive resist. In a positive resist, light energy changes the resist chemical structure from relatively insoluble to much more soluble through a process known in the art as photosolubilization.

Figure 5:
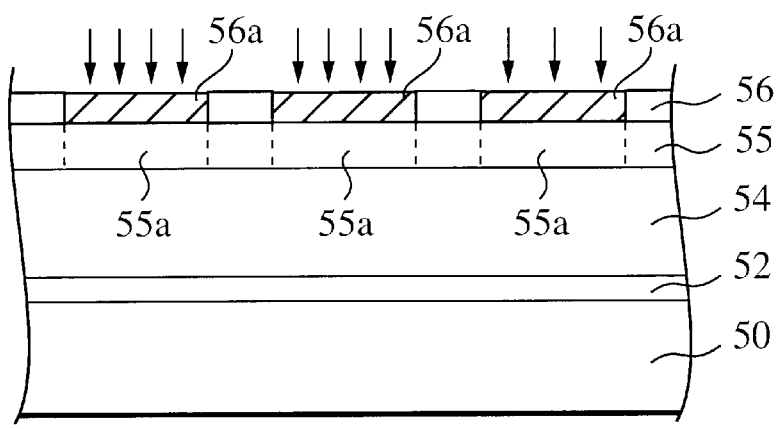
FIG. 5 illustrates a partial cross-sectional view of the MRAM structure of the present invention at a stage of processing subsequent to that shown in FIG. 4.

Reference is now made to FIG. 5. The positive photoresist layer 55 is exposed through a mask 56 (FIG. 5) with high-intensity UV light. The mask 56 may include any suitable pattern of opaque and clear regions that may depend, for example, on the desired pattern to be formed in the insulating layer 54. This way, portions 55a of the positive photoresist layer 55 are exposed through portions 56a of the mask 56 wherever portions of the insulating layer 54 need to be removed.

Although FIG. 5 schematically illustrates mask 56 positioned over the photoresist layer 55, those skilled in the art will appreciate that mask 56 is typically spaced from the photoresist layer 55 and light passing through mask 56 is focussed onto the photoresist layer 55.

Figure 6:
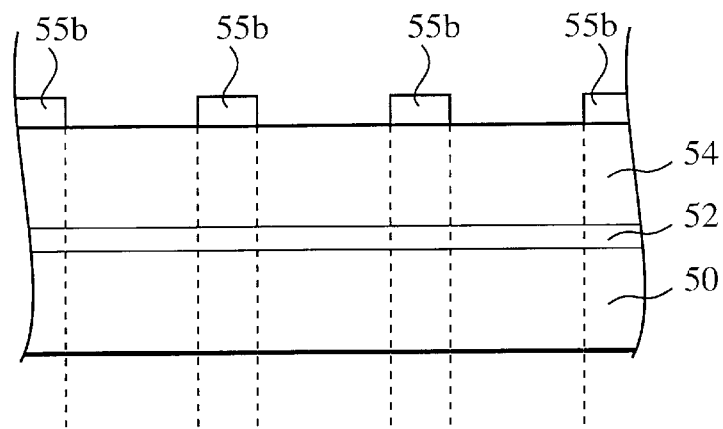
FIG. 6 illustrates a partial cross-sectional view of the MRAM structure of the present invention at a stage of processing subsequent to that shown in FIG. 5.

After exposure and development of the exposed portions 55a, portions of the photoresist are removed. Thus, after removal of the mask 56, portions 55b of unexposed and undeveloped photoresist are left over the insulating layer 54, as shown in FIG. 6.

Figure 7:
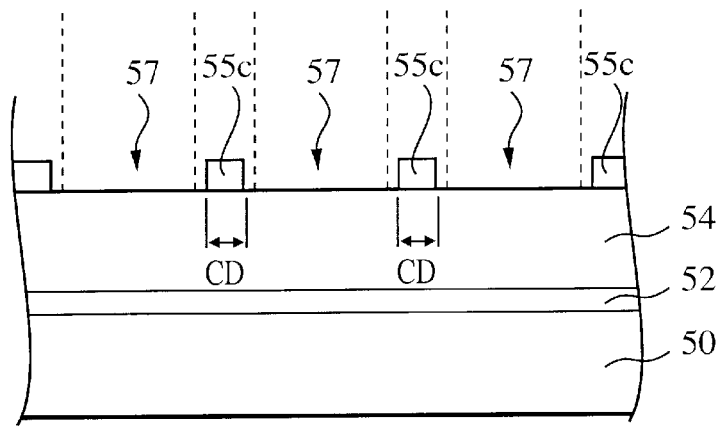
FIG. 7 illustrates a partial cross-sectional view of the MRAM structure of the present invention at a stage of processing subsequent to that shown in FIG. 6.

An etch step is next performed to further reduce or pull back portions 55b of the photoresist layer 55 to obtain portions 55c and openings 57, and to reach the optimum pullback critical dimension CD, as illustrated in FIG. 7. The etch may be a conventional wet etch or a reactive ion etch (RIE), for example, which allows control of the exposure rate to define the critical dimension CD (FIG. 7), in accordance with the particular characteristics of the photoresist material employed for the positive photoresist layer 55.

Figure 8:
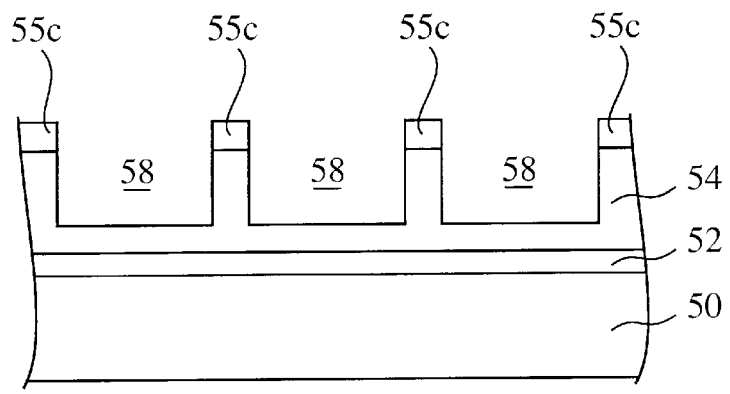
FIG. 8 illustrates a partial cross-sectional view of the MRAM structure of the present invention at a stage of processing subsequent to that shown in FIG. 7.
Figure 9:
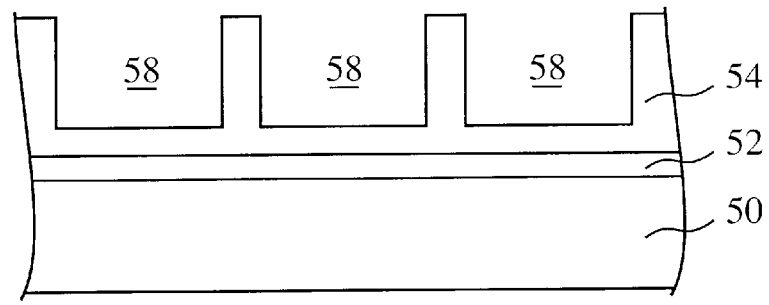
FIG. 9 illustrates a partial cross-sectional view of the MRAM structure of the present invention at a stage of processing subsequent to that shown in FIG. 8.

Reference is now made to FIG. 8. After formation of the portions 55c and of the openings 57 (FIG. 7), the structure of FIG. 7 is next etched to form grooves 58 in the insulating layer 54. The grooves 58 are etched to a depth of about 500

Angstroms to about 2,000 Angstroms, more preferably of about 1,000 Angstroms. Subsequent to the formation of the grooves 58, the remaining portions 55c of the positive photoresist layer 55 are then removed by chemicals, such as hot acetone or methylethylketone, or by flooding the substrate 50 with UV irradiation to degrade the remaining portions 55c to obtain the structure of FIG. 9.

Figure 10:
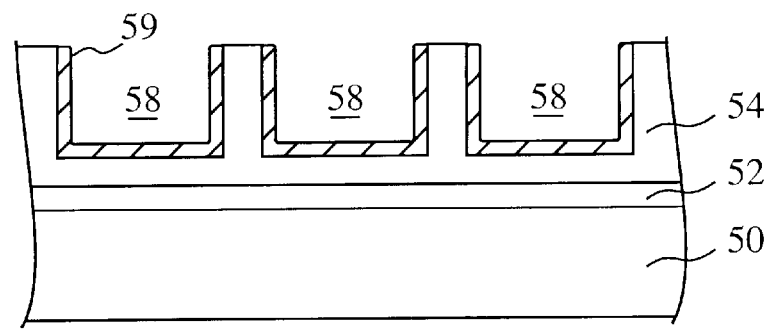
FIG. 10 illustrates a partial cross-sectional view of the MRAM structure of the present invention at a stage of processing subsequent to that shown in FIG. 9.

Subsequent to the formation of the grooves 58 (FIGS. 8–9), a thin barrier layer 59 is formed in the grooves 58 of the insulating layer 54, as shown in FIG. 10. The barrier layer 59 may comprise bonding materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum. In this embodiment, tantalum is deposited to a thickness of about 5 nm to about 10 nm.

Figure 11:
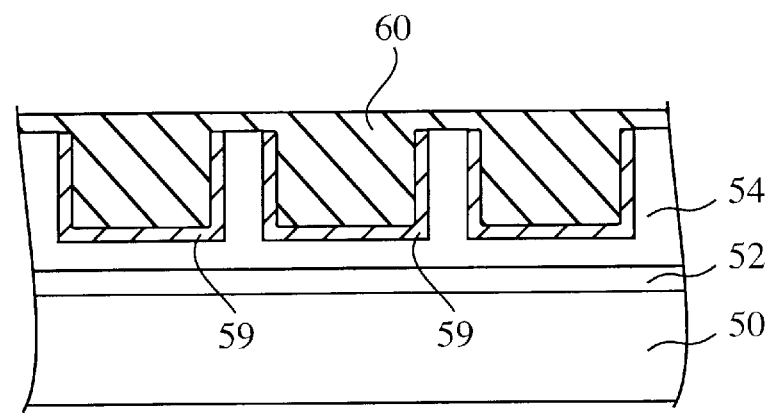
FIG. 11 illustrates a partial cross-sectional view of the MRAM structure of the present invention at a stage of processing subsequent to that shown in FIG. 10.

Next, as illustrated in FIG. 11, a conductive material layer 60 is formed over the barrier layer 59 and the insulating layer 54 to fill in the grooves 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 12:
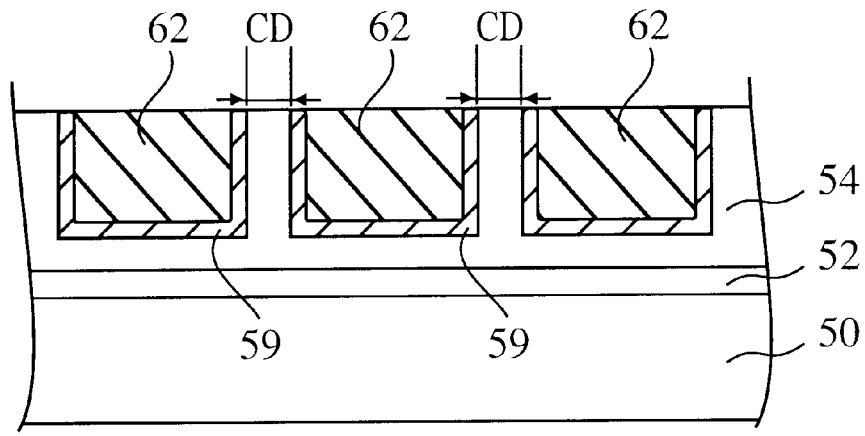
FIG. 12 illustrates a partial cross-sectional view of the MRAM structure of the present invention at a stage of processing subsequent to that shown in FIG 11.

The conductive material layer 60 is formed over the barrier layer 59 by deposition, for example, and is then etched back to form metal lines 62 (FIG. 12). In an exemplary embodiment of the present invention, the conductive material layer 60 is etched back by means of chemical mechanical polishing (CMP) or a well-known RIE dry etching process. Either way, the top surfaces of the barrier layer 59 and the metal lines 62 are substantially flat and uniform across the entire surface of the substrate, as shown in FIG. 12. The metal lines 62 are minimally spaced apart from each other by the critical dimension CD. Each metal line 62 will form the bit or digit line of a conventional MRAM structure.

Figure 17:
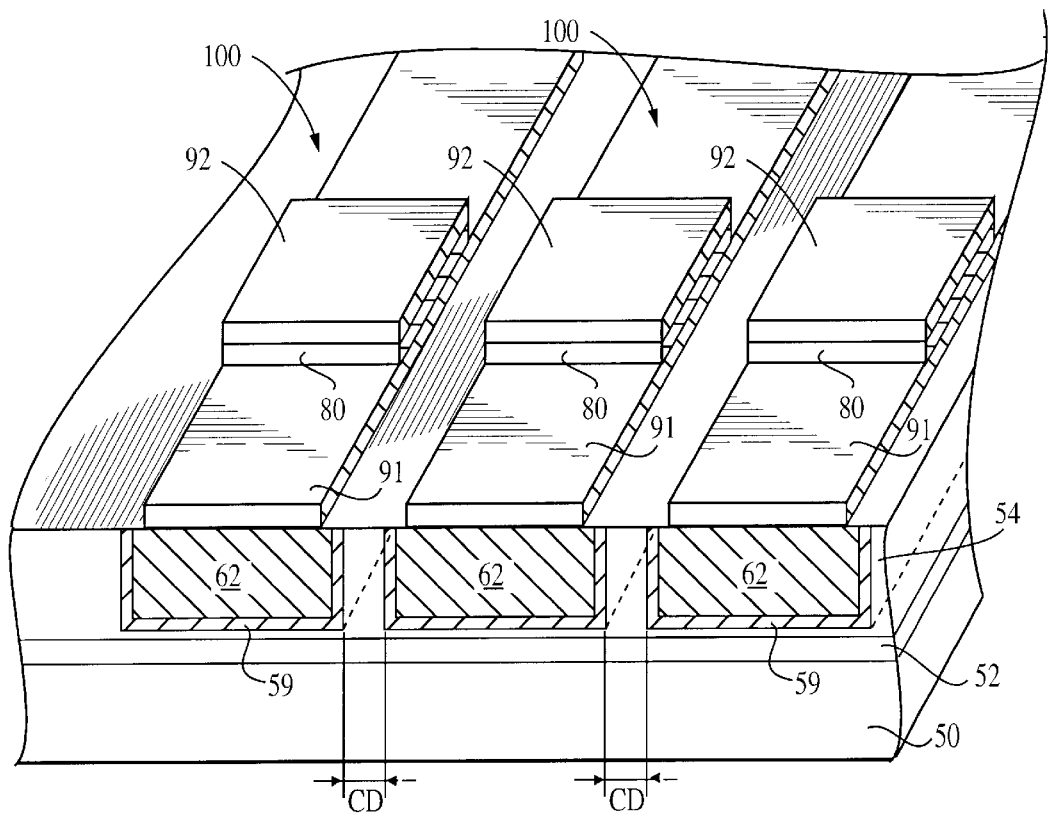
FIG. 17 illustrates a partial three-dimensional view of the MRAM structure of the present invention at a stage of processing subsequent to that shown in FIG. 15.
Figure 18:
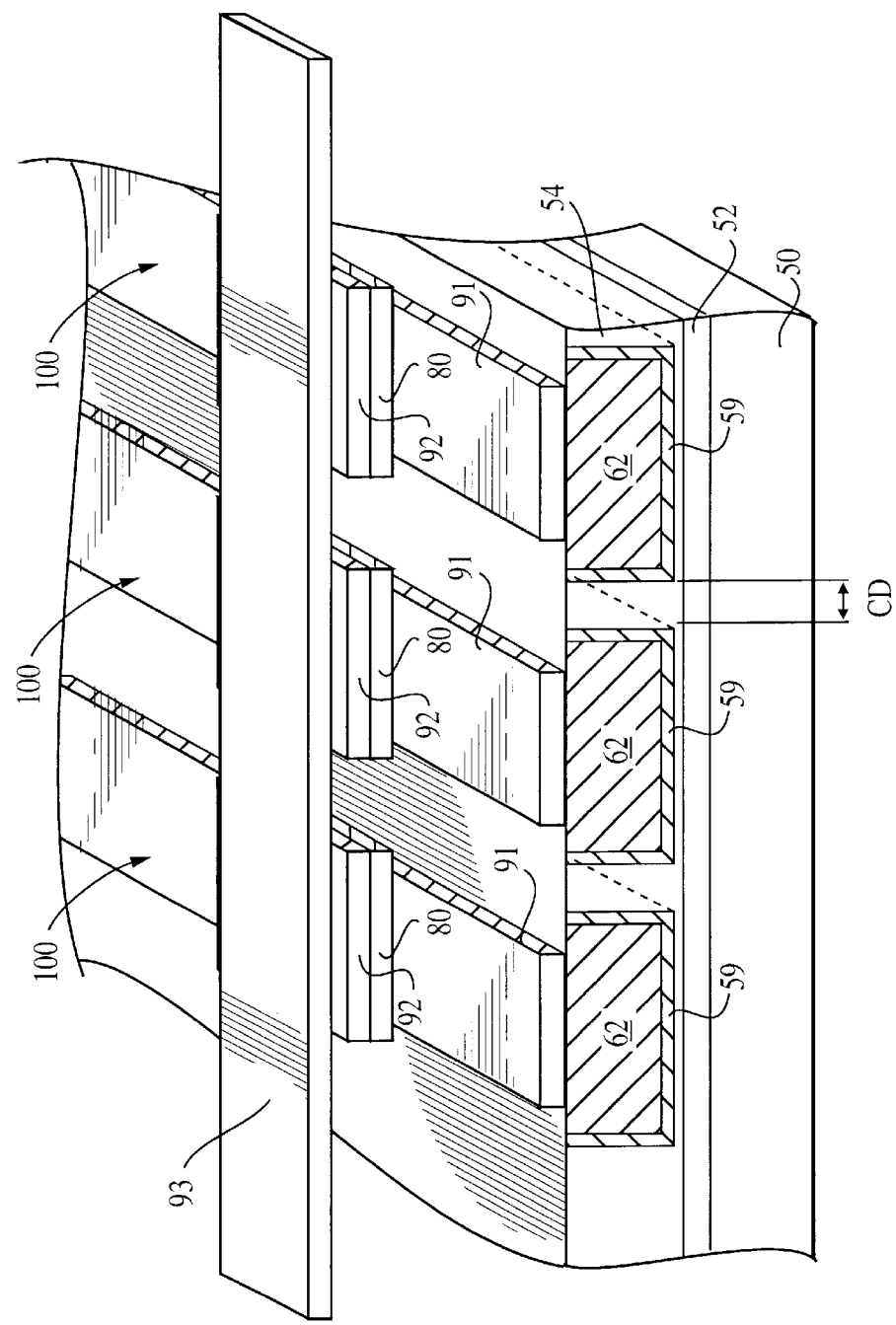
FIG. 18 illustrates a partial three-dimensional view of the MRAM structure of the present invention at a stage of processing subsequent to that shown in FIG. 17.

After the CMP polishing process, the processing steps for the completion of the MRAM structures 100 (FIG. 18) proceed according to known methods of the prior art. As such, a plurality of magnetic multilayer films constituting a first magnetic member 79 are first formed over the metal lines 62, which will be later patterned into pinned layers 91 (FIGS. 17–18). The first magnetic member 79 is formed of various material layers, described below in more detail, which are successively deposited over the metal lines 62 and the insulating layer 54, as illustrated in FIG. 13.

Figure 13:
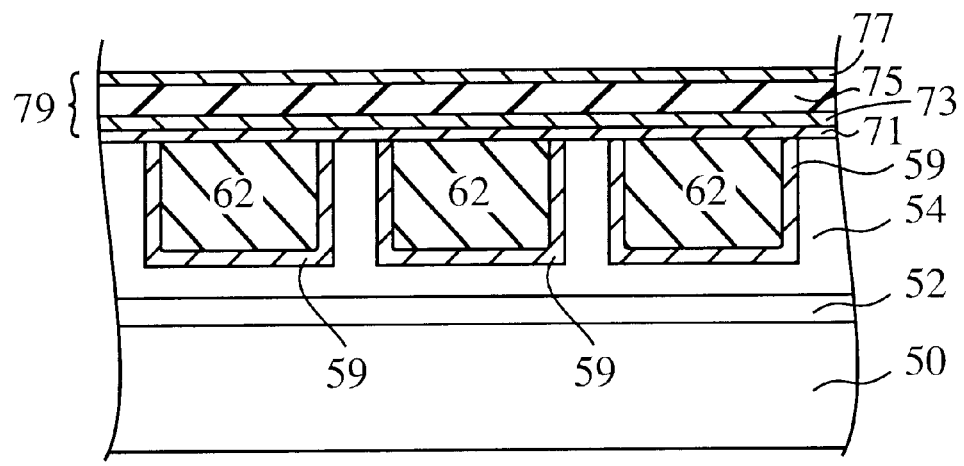
FIG. 13 illustrates a partial cross-sectional view of the MRAM structure of the present invention at a stage of processing subsequent to that shown in FIG. 12.

As such, in an exemplary embodiment of the present invention and as illustrated in FIG. 13, a first tantalum (Ta) layer 71 (of about 20–400 Angstroms thick, more preferably of about 50 Angstroms thick), a first nickel-iron (NiFe) layer 73 (of about 10–100 Angstroms thick, more preferably of about 60 Angstroms thick), a manganese-iron (MnFe) layer 75 (of about 10–100 Angstroms thick, more preferably of about 100 Angstroms thick) and a second nickel-iron (NiFe) layer 77 (of about 10–100 Angstroms thick, more preferably of about 60 Angstroms thick) are successively blanket deposited over the insulating layer 54 and the metal lines 62, to form the first magnetic member 79. Deposition of the layers 71, 73, 75 and 77 may be accomplished by magnetron sputtering, for example. However, other conventional deposition methods may be used also, as desired.

Figure 14:
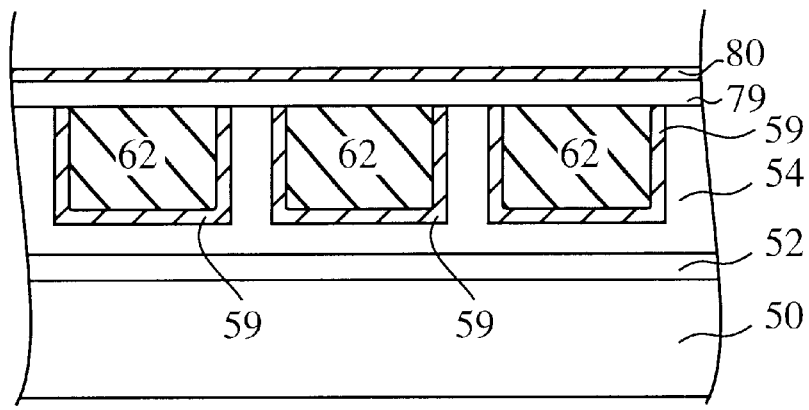
FIG. 14 illustrates a partial cross-sectional view of the MRAM structure of the present invention at a stage of processing subsequent to that shown in FIG. 13.

Following the deposition of the layers 71, 73, 75 and 77, a nonmagnetic, electrically nonconductive layer 80 formed of, for example, aluminum oxide ($Al_2O_3$) (of about 5–25 Angstroms thick, more preferably of about 15 Angstroms thick) is next formed overlying the first magnetic member 79, as shown in FIG. 14. Although aluminum oxide is the preferred material, it must be understood that the invention is not limited to its use, and other non-magnetic materials, such as titanium oxide ($TiO_2$), magnesium oxide (MgO), silicon oxide ($SiO_2$) or aluminum nitride (AN), may be used also.

Figure 15:
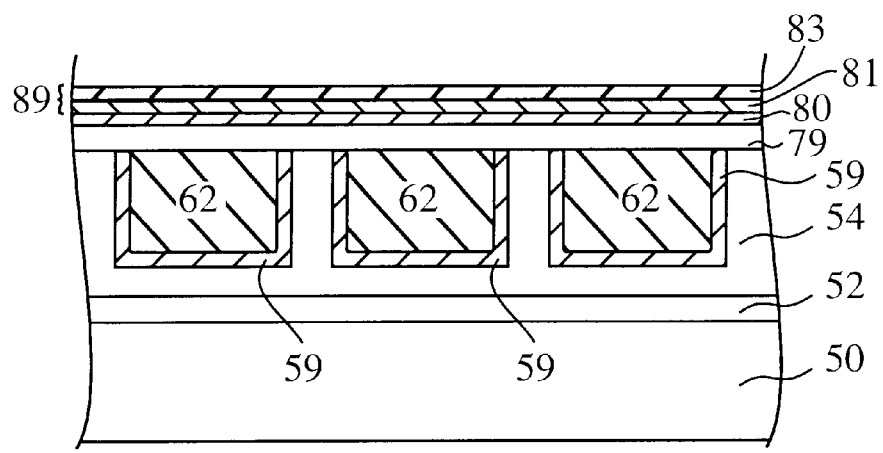
FIG. 15 illustrates a partial cross-sectional view of the MRAM structure of the present invention at a stage of processing subsequent to that shown in FIG. 14.
Figure 16:
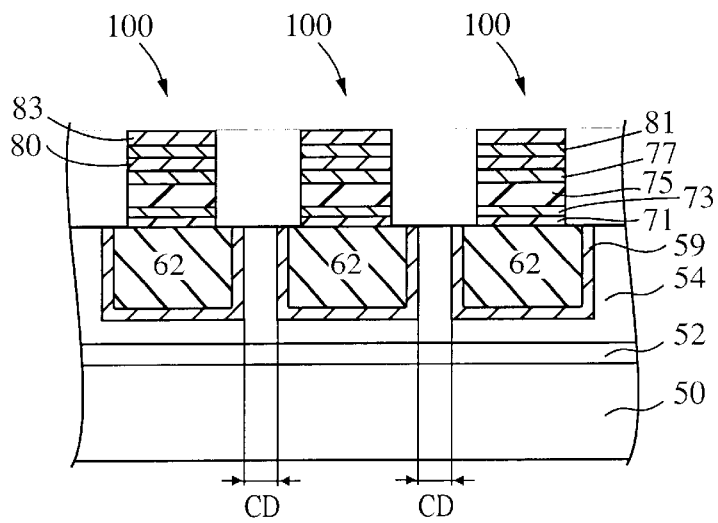
FIG. 16 illustrates a partial cross-sectional view of the MRAM structure of the present invention at a stage of processing subsequent to that shown in FIG. 15.

Referring now to FIG. 15, a plurality of magnetic multi-layer films forming a second magnetic member 89 are next formed over the nonmagnetic layer 80. Accordingly, in an exemplary embodiment of the present invention, a third nickel-iron (NiFe) layer 81 (of about 10–100 Angstroms thick, more preferably of about 40 Angstroms thick) and a second tantalum (Ta) layer 83 (of about 20–400 Angstroms thick, more preferably of about 50 Angstroms thick) are successively blanket deposited over the nonmagnetic layer 80, to form the second magnetic member 89, as shown in FIG. 15. Deposition of the layers 81 and 83 may be accomplished by magnetron sputtering, for example, but other conventional deposition methods may be used also, depending on the characteristics of the IC devices constructed previously to the formation of the MRAM structures 100 (FIG. 18).

Next, layers 71, 73, 75, 77, 80, 81, and 83 (FIGS. 13–15) are patterned into a plurality of MRAM structures or cells 100 (FIG. 18) including columns of pinned layers 91 and rows of sense layers 92. Thus, each MRAM structure 100 includes the pinned layer 91 (as part of the first magnetic member 79) separated from a sense layer 92 (as part of the second magnetic member 89) by the nonmagnetic layer 80. For simplicity, the multilayer stack forming the pinned layer 91 is illustrated in FIGS. 17–18 as a single layer. Similarly, the multilayer stack forming the sense layer 92 is also illustrated in FIGS. 17–18 as a single layer. It must be understood, however, that the pinned layer 91 includes portions of the copper line 62 and of the layers 71, 73, 75 and 77, while the sense layer 92 includes portions of the layers 81 and 83.

Patterning of the plurality of layers forming the pinned and sense layers of the MRAM structures 100 (FIG. 18), that is patterning of layers 71, 73, 75, 77, 80, 81, and 83 may be accomplished by ion milling which typically involves physical sputtering of each layer by an argon ion beam. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also.

Figure 1:
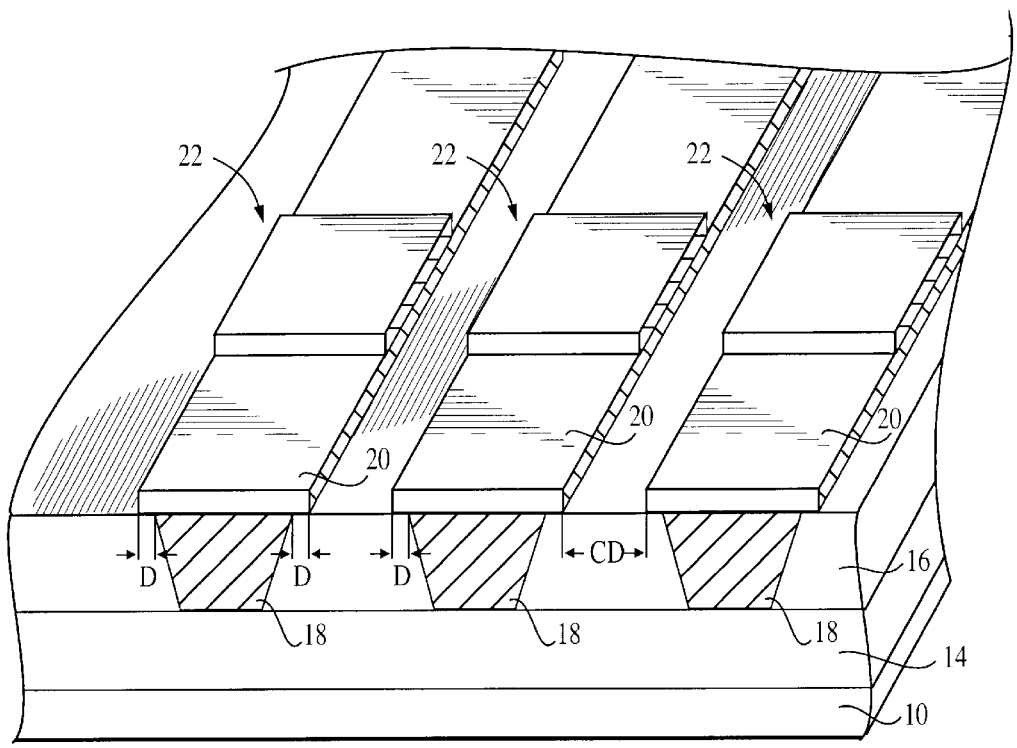
FIG. 1 is a schematic three-dimensional view of a portion of a conventional MRAM structure.

The pinned and sense layers 91, 92 are patterned and etched so that the pinned layers 91 correspond to the metal lines 62 that form the bottom electrodes of the pinned layers 91. This way, the pinned layers 91 of the MRAM structures 100 are spaced apart from each other by a minimal distance or critical dimension CD lower than 0.20 $\mu$m, and preferably less than or equal to 0.1 $\mu$m, and more preferably less than or equal to 0.05 $\mu$m, which was obtained by cutting back the photoresist areas 55b as described above with reference to FIGS. 5–9. In addition, the overlay distance D (FIG. 1) on each side of the pinned layer or digit line 91, which characterizes the MRAM structures of the prior art, is eliminated. Further, employing a photolithography technique and a photoresist allows formation of long and continuous copper lines, of more than 2,000 Angstroms, such as the metal lines 62 (FIGS. 12–18), which are necessary for long digit lines and which are not typically achieved by conventional damascene processes.

Additional steps to create a functional MRAM cell may be carried out. Thus, additional insulating layers and word line conductors to enable bidirectional current flow in the presence of a read and write signal may be formed to complete the fabrication process of such MRAM structures. For example, FIG. 18 illustrates three MRAM cell structures 100 formed of a word line 93 that intersects three pinned layers 91 and associated sense layers 92. As known in the art, the word line 93 may be formed of copper, for example. The space between the adjacent pinned layers and sense layers 91, 92, and below the word line 93 may be filled with an insulator, for example, aluminum oxide or an amorphous dielectric such as bias sputtered quartz.

Figure 19:
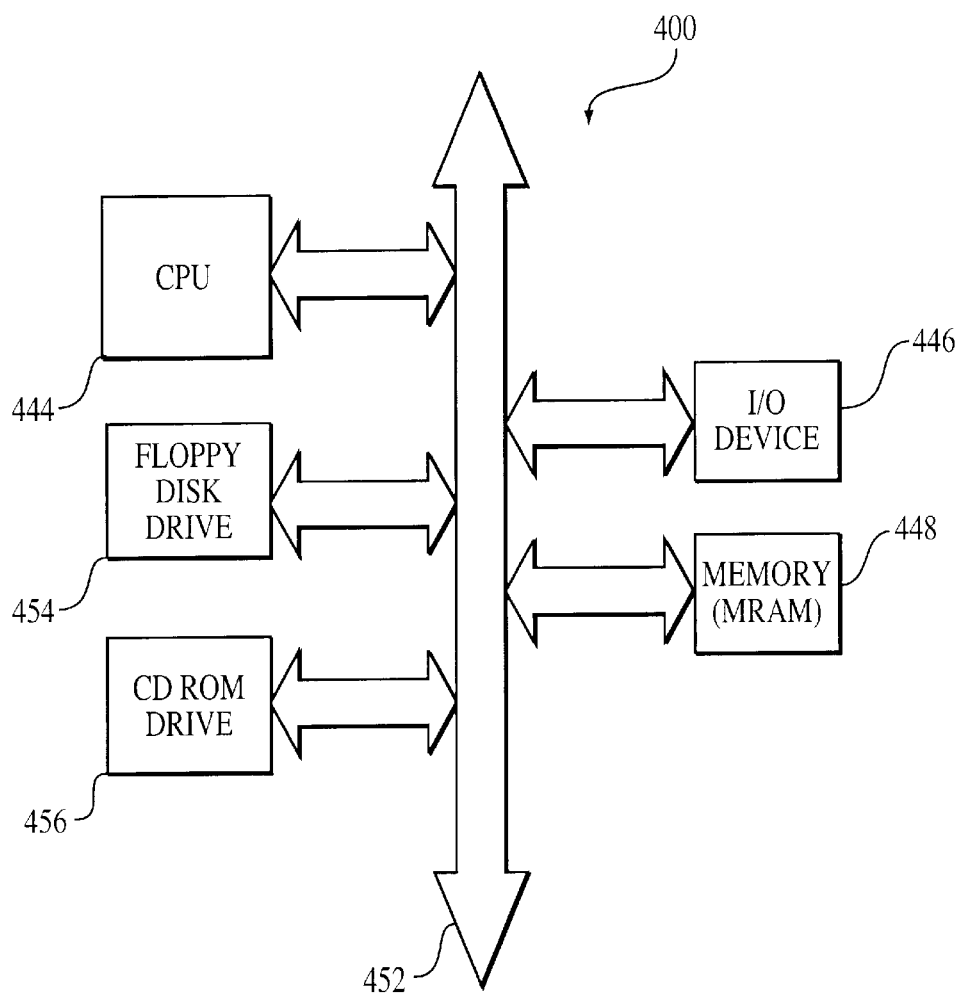
FIG. 19 is a schematic diagram of a processor system incorporating an MRAM memory structure constructed in accordance with the present invention.

A typical processor based system 400 which includes a memory circuit 448, for example an MRAM with MRAM cell structures 100 (FIG. 18) constructed according to the present invention is illustrated in FIG. 19. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 may be combined with the processor, i.e. CPU 444, in a single integrated circuit.

Although the exemplary embodiments described above illustrate the formation of three MRAM cell structures 100 (FIG. 18) it is to be understood that the present invention contemplates the use of a plurality of pinned layers and sense layers as part of a plurality of MRAM cells arranged in rows and columns in a memory cell array. In addition, although the exemplary embodiments described above refer to a specific topography of the MRAM structures with specific magnetic materials forming such structures, it must be understood that the invention is not limited to the above-mentioned magnetic materials, and other magnetic and ferromagnetic materials, such as nickel-iron (Permalloy) or iron, among others, may be used also. Further, although the exemplary embodiments described above refer to patterning of the MRAM structures by reactive plasma etching, it must be understood that the present invention contemplates the use of other methods of patterning and etching.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming at least one magnetic random access memory cell structure, said method comprising:

forming a mask layer having a predetermined pattern over an insulating layer, said predetermined pattern including first photoresist areas each formed of a masking material of a predetermined width;

reducing said predetermined width of said first photoresist areas to form second reduced-width photoresist areas;

forming at least one groove in said insulating layer using said second reduced-width photoresist areas as a mask;

forming a conductive layer in said at least one groove; and forming a first magnetic layer over said conductive layer.

2. The method of claim 1, further comprising forming a second magnetic layer over said first magnetic layer.

3. The method of claim 2, further comprising forming a word line over said second magnetic layer.

4. The method of claim 1, wherein said act of forming said at least one groove further comprises etching said insulating layer.

5. The method of claim 1, wherein said act of reducing said predetermined width includes removing portions of said first photoresist areas by etching said first photoresist areas.

6. The method of claim 5, wherein said etching is a reactive ion etching.

7. The method of claim 1, wherein said act of forming said conductive layer further comprises depositing a conductive material inside said at least one groove and planarizing the upper surface of said insulating layer.

8. The method of claim 7, wherein said conductive material is copper.

9. The method of claim 7 further comprising forming a barrier layer in said at least one groove before depositing said conductive material.

10. The method of claim 7 further comprising forming an adhesion layer in said at least one groove before depositing said conductive material.

11. The method of claim 1, wherein said act of forming said first magnetic layer further comprises the step of forming a first plurality of stacked layers, said first plurality of stacked layers including at least one magnetic material layer.

12. The method of claim 11, wherein said magnetic material layer contains a material selected from the group consisting of tantalum, nickel-iron, tungsten-nitrogen, nickel, cobalt-nickel-iron, iron, and manganese-iron.

13. The method of claim 12, wherein said first plurality of stacked layers comprises layers of tantalum, nickel-iron and manganese-iron.

14. The method of claim 11 further comprising etching said first plurality of stacked layers to have a width which coincides with the width of said conductive layer.

15. The method of claim 2, wherein said act of forming said second magnetic layer further comprises forming a second plurality of stacked layers, said second plurality of stacked layers including at least one magnetic material layer.

16. The method of claim 15, wherein said magnetic material layer includes a material selected from the group consisting of tantalum, nickel-iron, tungsten-nitrogen, nickel, cobalt-nickel-iron, iron, and manganese-iron.

17. The method of claim 16, wherein said second plurality of stacked layers comprises layers of tantalum, nickel-iron and tungsten-nitrogen.

18. The method of claim 15 further comprising etching said second plurality of stacked layers.

19. The method of claim 2 further comprising forming a nonmagnetic layer between said first and second magnetic layers.

20. The method of claim 19, wherein said nonmagnetic layer is formed of a material selected from the group consisting of aluminum oxide, titanium oxide, magnesium oxide, silicon oxide and aluminum nitride.

21. The method of claim 19, wherein said nonmagnetic layer is formed of aluminum oxide.

22. The method of claim 1, wherein said conductive layer is longer than 2,000 Angstroms.

23. The method of claim 1, wherein said first magnetic layer has a pinned magnetic orientation.

24. The method of claim 2, wherein said second magnetic layer has a free magnetic orientation.

25. A method of forming a plurality of magnetic random access memory cells over an insulating layer of a semiconductor substrate, said method comprising:
  forming a photoresist layer defining a predetermined pattern over said insulating layer, said photoresist layer including first photoresist areas having a predetermined width;
  reducing said predetermined width of said first photoresist areas to form second reduced-width photoresist areas;
  forming a plurality of grooves in said insulating layer using said second reduced-width photoresist areas as a mask;
  forming a plurality of bit line conductive layers in said grooves, said plurality of bit line conductive layers being spaced apart from each other by less than 0.20 µm;
  forming a plurality of first magnetic layers over respective bit line conductive layers;
  forming a plurality of second magnetic layers spaced along said first magnetic layers; and
  forming a plurality of word layers over respective sets of second magnetic layers, said word lines running substantially orthogonal to said first magnetic layers.

26. The method of claim 25, wherein said act of forming said grooves further comprises etching said insulating layer.

27. The method of claim 25, wherein said act of reducing said predetermined width of said first photoresist areas further includes removing portions of said first photoresist areas by etching said first photoresist areas.

28. The method of claim 27, wherein said etching is a reactive ion etching.

29. The method of claim 25, wherein said act of forming said bit line conductive layers further comprises depositing a conductive material inside said grooves.

30. The method of claim 29, wherein said conductive material is copper.

31. The method of claim 29 further comprising forming a barrier layer in said grooves before depositing said conductive material.

32. The method of claim 29 further comprising forming an adhesion layer in said grooves before depositing said conductive material.

33. The method of claim 25, wherein said act of forming said plurality of first magnetic layers further comprises forming a first plurality of stacked layers, said first plurality of stacked layers including at least one magnetic material.

34. The method of claim 33, wherein said magnetic material is selected from the group consisting of tantalum, nickel-iron, tungsten-nitrogen, nickel, cobalt-nickel-iron, iron, and manganese-iron.

35. The method of claim 34, wherein said first plurality of stacked layers comprises layers of tantalum, nickel-iron and manganese-iron.

36. The method of claim 33 further comprising etching said first plurality of stacked layers so that said stacked layers are spaced apart from each other by less than 0.20 µm.

37. The method of claim 25, wherein said act of forming said plurality of second magnetic layers further comprises forming a second plurality of stacked layers, said second plurality of stacked layers including at least one magnetic material.

38. The method of claim 37, wherein said magnetic material is selected from the group consisting of tantalum, nickel-iron, tungsten-nitrogen, nickel, cobalt-nickel-iron, iron, and manganese-iron.

39. The method of claim 38, wherein said second plurality of stacked layers comprises layers of tantalum, nickel-iron and tungsten-nitrogen.

40. The method of claim 25 further comprising forming a nonmagnetic layer between said plurality of first magnetic layers and said plurality of second magnetic layers.

41. The method of claim 40, wherein said nonmagnetic layer is formed of a material selected from the group consisting of aluminum oxide, titanium oxide, magnesium oxide, silicon oxide and aluminum nitride.

42. The method of claim 40, wherein said nonmagnetic layer is formed of aluminum oxide.

43. The method of claim 25, wherein said bit line conductive layers are spaced apart by a distance less than or equal to about 0.1 µm.

44. The method of claim 25, wherein said plurality of bit line conductive layers are spaced apart by a distance less than or equal to about 0.05 µm.

45. The method of claim 25, wherein said plurality of first magnetic layers have a pinned magnetic orientation.

46. The method of claim 25, wherein said plurality of second magnetic layers have a free magnetic orientation.

47. A method of forming at least one magnetic random access memory cell structure, said method comprising:
  forming a mask layer having a predetermined pattern over an insulating layer, said predetermined pattern including first photoresist areas each formed of a masking material of a predetermined width;
  reducing said predetermined width of said first photoresist areas to form second reduced-width photoresist areas;
  forming at least one groove in said insulating layer using said second reduced-width photoresist areas as a mask;
  forming a conductive layer in said at least one groove; and
  forming a first plurality of stacked layers over said conductive layer, said first plurality of stacked layers including at least one magnetic material layer containing a material selected from the group consisting of tantalum, nickel-iron, tungsten-nitrogen, nickel, cobalt-nickel-iron, iron, and manganese-iron.

48. The method of claim further comprising forming a second plurality of stacked layers over said first plurality of stacked layers, said second plurality of stacked layers including at least one magnetic material layer containing a material selected from the group consisting of tantalum, nickel-iron, tungsten-nitrogen, nickel, cobalt-nickel-iron, iron, and manganese-iron.

49. The method of claim 47, wherein said least one magnetic material layer of said first plurality of stacked layers has a pinned magnetic orientation.

50. The method of claim 48, wherein said at least one magnetic material layer of said second plurality of stacked layers has a free magnetic orientation.

51. A method of forming a plurality of magnetic random access memory cells over an insulating layer of a semiconductor substrate, said method comprising:
  forming a photoresist layer defining a predetermined pattern over said insulating layer, said photoresist layer including first photoresist areas having a predetermined width;

reducing said predetermined width of said first photoresist areas to form second reduced-width photoresist areas;

forming a plurality of grooves in said insulating layer using said second reduced-width photoresist areas as a mask;

forming a plurality of bit line conductive layers in said grooves, said plurality of bit line conductive layers being spaced apart from each other by a distance less than or equal to less than 0.05 μm;

forming a plurality of first magnetic layers over respective bit line conductive layers, said plurality of first magnetic layers having a pinned magnetic orientation;

forming a plurality of second magnetic layers spaced along said first magnetic layers, said plurality of second magnetic layers having a free magnetic orientation; and forming a plurality of word layers over respective sets of second magnetic layers, said word lines running substantially orthogonal to said first magnetic layers.

52. The method of claim 51, wherein said act of forming said plurality of first magnetic layers further comprises forming a first plurality of stacked layers, said first plurality of stacked layers including at least one magnetic material.

53. The method of claim 52, wherein said magnetic material is selected from the group consisting of tantalum, nickel-iron, tungsten-nitrogen, nickel, cobalt-nickel-iron, iron, and manganese-iron.

54. The method of claim 51, wherein said act of forming said plurality of second magnetic layers further comprises forming a second plurality of stacked layers, said second plurality of stacked layers including at least one magnetic material.

55. The method of claims, wherein said magnetic material is selected from the group consisting of tantalum, nickel-iron, tungsten-nitrogen, nickel, cobalt-nickel-iron, iron, and manganese-iron.

* * * * *

UNITED STATES PATENT AND TRADEMARK OFFICE
CERTIFICATE OF CORRECTION

PATENT NO. : 6,689,661 B2
DATED : February 10, 2004
INVENTOR(S) : D. M. Durcan et al.

It is certified that error appears in the above-identified patent and that said Letters Patent is hereby corrected as shown below:

Column 10,
Line 48, change "claim further" to -- claim 47 further --; and

Column 12,
Line 14, change "claims," to -- claim 54 --.

Signed and Sealed this

Eighteenth Day of May, 2004

JON W. DUDAS
*Acting Director of the United States Patent and Trademark Office*